US006447980B1

(12) United States Patent
Rahman et al.

(10) Patent No.: US 6,447,980 B1
(45) Date of Patent: Sep. 10, 2002

(54) PHOTORESIST COMPOSITION FOR DEEP UV AND PROCESS THEREOF

(75) Inventors: M. Dalil Rahman, Flemington; Munirathna Padmanaban, Bridgewater; Ralph R. Dammel, Flemington, all of NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/619,336

(22) Filed: Jul. 19, 2000

(51) Int. Cl.[7] ............................................. G03C 1/492
(52) U.S. Cl. ..................... 430/270.1; 430/326; 430/914
(58) Field of Search ............................. 430/270.1, 914, 430/326

(56) References Cited

U.S. PATENT DOCUMENTS

| 4,491,628 A | 1/1985 | Ito ............................. 430/176 |
| 5,350,660 A | 9/1994 | Urano ......................... 430/176 |
| 5,843,624 A | 12/1998 | Houlihan .................... 430/296 |
| 6,147,249 A | * 11/2000 | Watanabe et al. ........... 560/120 |
| 6,277,538 B1 | * 8/2001 | Choi et al. ............... 430/270.1 |

FOREIGN PATENT DOCUMENTS

| EP | 1 085 379 A1 | 9/2000 |
| EP | 1 172 694 A1 | 1/2001 |
| GB | 2 320 718 A | 7/1998 |

OTHER PUBLICATIONS

Nakano et al, "Adhesion Characteristics of Alicyclic Polymers for use in ArF Excimer Laser Lithography", Proc. SPIE, vol. 3333, pp. 43 through 52 (1998).
Nozaki et al., "A Novel Polymer for a 193–nm Resist", J. Photopolym. Sc. & Tach vol. 9, No. 3, 1996, pp. 509–522.
T. Wallow et al "Reactive ion etching of 193 nm resist candidates: current platforms, future requirements", Proc. SPIE, vol. 3333, 92 (1998).
J. C. Jung et al, "Design of cycloolefin–maleic anhydride resist for ArF lithography", Proc SPIE vol., 3333, pp. 11 through 25, (1998).
Yasunori Uetani et al., "Standard Developer Available ArF Resist and Performance", SPIE, vol. 3333, pp. 546–553.
Joo–Hyeon Park et al., "ArF Photoresist System Using Alicyclic Polymer", SPIE, vol. 3049, pp. 485–491.

* cited by examiner

*Primary Examiner*—Rosemary Ashton
(74) *Attorney, Agent, or Firm*—Sangya Jain

(57) ABSTRACT

The present invention relates to a chemically amplified system, which is, sensitive to wavelengths between 300 nm and 100 nm, and comprises a) a polymer that is insoluble an aqueous alkaline solution and comprises at least one acid labile group, b) a compound capable of producing an acid upon radiation. The present invention comprises a polymer that is made from a alicyclic hydrocarbon olefin, an acrylate with a pendant cyclic moeity, and a cyclic anhydride. The present invention also relates to a process for imaging such a photoresist.

12 Claims, No Drawings

PHOTORESIST COMPOSITION FOR DEEP UV AND PROCESS THEREOF

FIELD OF INVENTION

The present invention relates to a photoresist composition sensitive to radiation in the deep ultraviolet, particularly a positive working photoresist sensitive in the range of 100–300 nanometers(nm). The present invention also relates to a process for imaging the photoresist composition of this invention.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm can also be used where subhalfmicron geometries are required. Particularly preferred are photoresists comprising non-aromatic polymers, a photoacid generator, optionally a solubility inhibitor, and solvent.

High resolution, chemically amplified, deep ultraviolet (100–300 nm) positive and negative tone photoresists are available for patterning images with less than quarter micron geometries. Chemically amplified resists, in which a single photo generated proton catalytically cleaves several acid labile groups, are used in photolithography applicable to sub quarter-micron design rules. As a result of the catalytic reaction, the sensitivity of the resulting resist is quite high compared to the conventional novolak-diazonaphthoquinone resists. To date, there are three major deep ultraviolet (uv) exposure technologies that have provided significant advancement in miniaturization, and these are lasers that emit radiation at 248 nm, 193 nm and 157 nm. Examples of such photoresists are given in the following patents and incorporated herein by reference, U.S. Pat. No. 4,491,628, U.S. Pat. No. 5,350,660, U.S. Pat. No. 5,843,624 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by the absence of aromatics.

Photoresists based on chemical amplification mechanism are employed for 248 and 193 nm applications. However, the resist materials applicable for 248 nm cannot be used at 193 nm due to the high absorption of the poly(4-hydroxystyrene) based polymers used for 248 nm applications. 193 nm applications typically require non-aromatic compounds. Open-chain aliphatic resins cannot be used due to the very high etch rates of these materials. Polymers possessing annelated structures in the side chains such as tricyclododecyl and adamantane or cycloolefins in the main chain are shown to provide etch resistance close to poly(4-hydroxystyrene) polymers [Nakano et al. Proc. SPIE 3333, 43 (1998), Nozaki et al. J. Photopolym. Sci. & Tech. Vol. 9, 11, (1998), T. I. Wallow et al. Proc. SPIE 3333, 92 (1998), and J. C. Jung et al. Proc. SPIE 3333, 11, (1998)].

Houlihan et al (U.S. Pat. No. 5,843,624), disclose a polymer for photoresist application, which is a polymer made from a cyclic olefin, maleic anhydride and a substituted or unsubstituted acrylate. The patent describes the substituted acrylate as one where the substituent is acid labile and includes t-butyl, t-amyl, 1-methylcyclohexyl, 3-oxocyclohexyl, and bis(2-trimethylsilyl)ethyl.

The present invention relates to a chemically amplified system, which is sensitive to wavelengths between 300 nm and 100 nm, and comprises a) a polymer that is insoluble an aqueous alkaline solution and comprises at least one acid labile group, b) a compound capable of producing an acid upon radiation. The present invention comprises a polymer that is made from a nonaromatic cyclo olefin, an acrylate with a pendant cyclic moeity, and a cyclic anhydride, preferably the pendant cyclo olefin is multicyclic since these groups offer better etch resistance. The polymer is inhibited from dissolving in water or the alkaline developer by having acid labile groups within the polymer. The polymer is particularly suited for exposures below 200 nm, since it preferably does not contain any or may contain minimal aromatic functionalities.

SUMMARY OF THE INVENTION

The present invention relates to a novel photoresist composition sensitive to radiation in the deep ultraviolet, particularly a positive working photoresist sensitive in the range of 100–300 nm. The photoresist composition comprises a) a polymer that is insoluble in an aqueous alkaline solution and comprises at least one acid labile group, and further where the polymer comprises an alicyclic hydrocarbon unit, a cyclic anhydride and a unit with the structure:

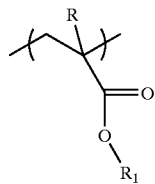

where,

R is H or ($C_1$–$C_4$)alkyl, and $R_1$ is a nonaromatic cyclic moeity; and, b) a compound or a mixture of compounds capable of producing acid upon irrradiation. The photoresist is irradiated preferably with wavelength of light at 193 nm or 157 nm.

The invention also relates to a process of imaging the novel positive photoresist composition comprising the steps of a) coating a substrate with the novel photoresist composition, b) baking the substrate to substantially remove the solvent, c) imagewise irradiating the photoresist film, d) baking the photoresist, and e) developing the irradiated film using an alkali developer. The invention further relates to a process of making a polymer under pressure.

DETAIL DESCRIPTION OF THE INVENTION

The present invention relates to a chemically amplified system, which is sensitive to wavelengths between 300 nm and 100 nm, and comprises a) a polymer that is insoluble an aqueous alkaline solution and comprises at least one acid labile group, and b) a compound capable of producing an acid upon radiation. The present invention comprises a polymer that is made from at least one aliphatic cyclo olefin monomer, at least one acrylate monomer with a pendant nonaromatic cyclic moeity, and at least one cyclic anhydride monomer. Preferably the pendant nonaromatic cyclic moeity is multicyclic.

The cyclo olefin is incorporated into the backbone of the polymer and may be any substituted or unsubstituted multicyclic hydrocarbon containing an unsaturated bond. The polymer may be synthesized from one or more cyclo olefin monomers having an unsaturated bond. The cyclo olefin monomers may be substituted or unsubstituted norbornene, or tetracyclododecene. The substituents on the cyclo olefin may be aliphatic or cycloaliphatic alkyls, esters, acids, hydroxyl, nitrile or alkyl derivatives. Examples of cyclo olefin monomers, without limitation, are:

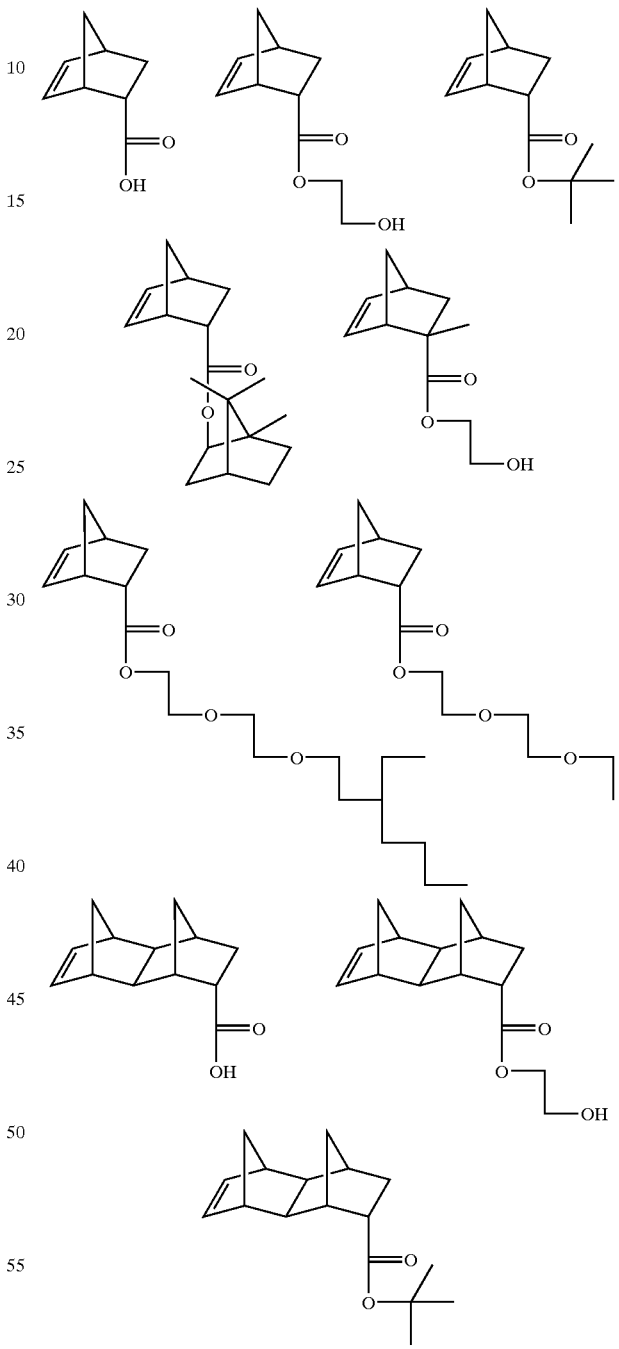

Other cyclo olefin monomers which may also be used in synthesizing the polymer are:

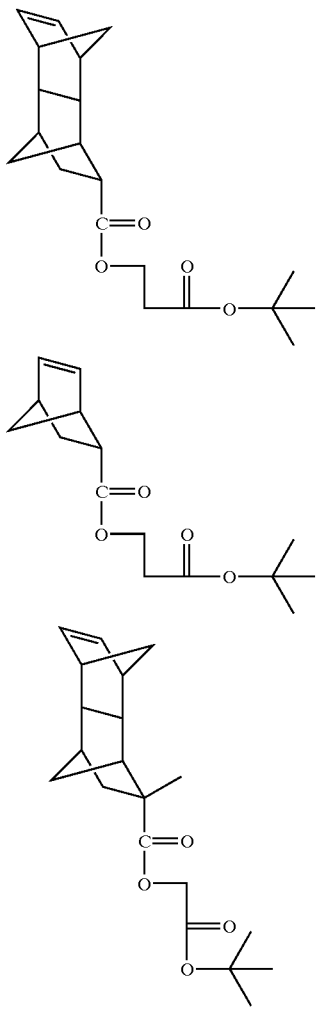

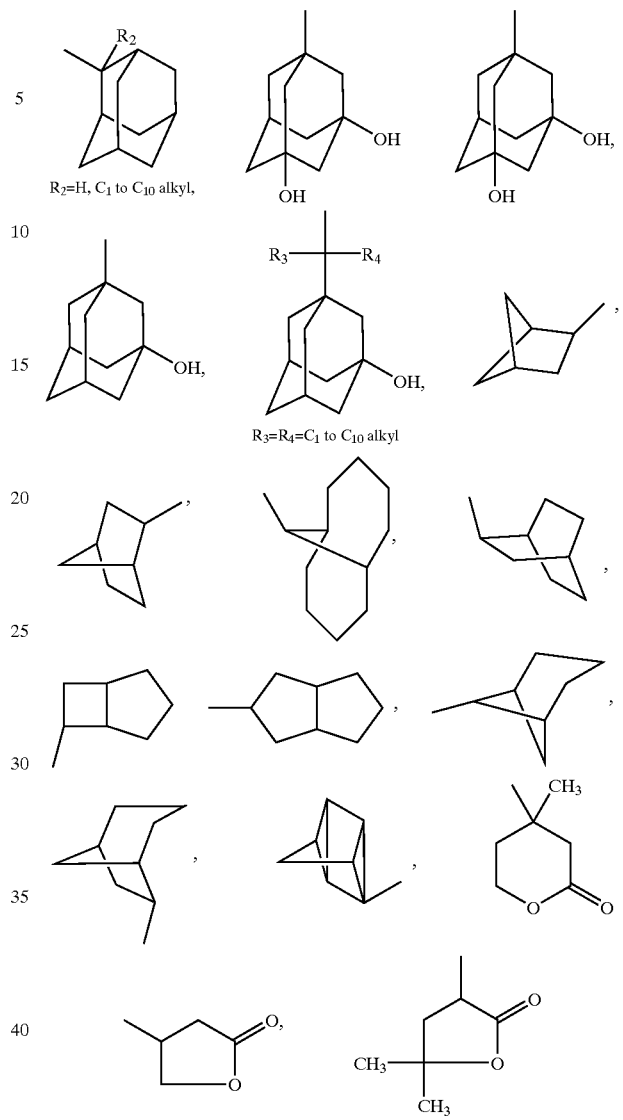

The acrylate monomer or monomers used in the synthesis of the polymer are of the following structure, furthermore, acrylate as referred to in this application refers generally to alkyl substituted or unsubstituted monomers, such as methacrylate, ethacrylate, etc.:

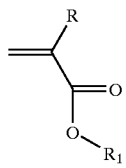

where,

R₁ is a cyclic moeity, preferably a nonaromatic cyclic moeity and where,

R in the above structures is hydrogen or ($C_1$–$C_4$) alkyl. More preferred structures for $R_1$ are:

Preferably the cyclo olefin monomer is selected from t-butyl norbornene carboxylate (BNC), hydroxyethyl norbornene carboxylate (HNC), norbornene carboxylic acid (NC), t-butyl tetracyclo[4.4.0.$^{2,6}$1.$^{7,10}$]dodec-8-ene-3-carboxylate, and t-butoxycarbonylmethyl tetracyclo [4.4.0.1.$^{2,6}$1.$^{7,10}$]dodec-8-ene-3-carboxylate; more preferably the cyclo olefins are selected from t-butyl norbornene carboxylate (BNC), hydroxyethyl norbornene carboxylate (HNC), and norbornene carboxylic acid(NC).

The preferred acrylate monomers are selected from mevaloniclactone methacrylate (MLMA), 2-methyladamantyl methacrylate (MAdMA), isoadamantyl methacrylate, 3-hydroxy-1-methacryloxyadamatane, 3,5-dihydroxy-1-methacryloxyadamantane, β-methacryloxy-γ-butyrolactone, and α-methacryloxy-γ-butyrolactone. More preferably the acrylate monomers are selected from mevaloniclactone methacrylate (MLMA) and 2-methyladamantyl methacrylate (MAdMA). The cyclic anhydride is preferably maleic anhydride.

The cyclo olefin and the cyclic anhydride monomer are believed to form an alternating polymeric structure, and the amount of the acrylate monomer incorporated into the polymer can be varied to give the optimal lithographic properties. The percentage of the acrylate monomer relative to the cyclo olefin/anhydride monomers within the polymer ranges from about 95 mole % to about 5 mole %, preferably from about 75 mole % to about 25 mole %, and most preferably from about 55 mole % to about 45 mole %.

The polymer of this invention can be synthesized using techniques known in the art. The polymer of this invention may be synthesized by free radical polymerization technique using, for example, 2,2'-azobisisobutyronitrile (AIBN) as initiator. A mixture of monomers is added to a reaction vessel together with a solvent, e.g. tetrahydrofuran, and AIBN is added. The reaction is carried out at a suitable temperature for a suitable amount of time to give a polymer with desired properties. The reaction may also be carried out without a solvent. The temperature may range from about 35° C. to about 150° C., preferably 50° C. to 90° C. for about 5 to 25 hours. The reaction may be carried out at atmospheric pressure or at higher pressures. It has been found that a reaction carried out under a pressure of from about 48,000 Pascals to about 250,000 Pascals gives a polymer with more consistent properties, where examples of such desirable properties are molecular weight, dark film loss, yield, etc. Dark film loss is a measure of the solubility of the unexposed photoresist film in the developing solution, and a minimal film loss is preferred. The polymer may be isolated from any suitable solvent, such as, diethyl ether, hexane or mixture of both hexane and ether. Other polymerization techniques may be used to obtain a polymer with the desired chemical and physical properties.

The optimum molecular weight of the polymer is dependant on the monomers incorporated into the polymer, the photoactive compound and any other chemical components used, and on the lithographic performance desired. Typically, the weight average molecular weight is in the range of 3,000 to 50,000, the number average molecular weight is in the range from about 1500 to about 10,000, and the polydispersity is in the range 1.1 to 5, preferably 1.5 to 2.5.

Suitable examples, without limitation, of the acid generating photosensitive compound include onium-salts, such as, diazonium salts, iodonium salts, sulfonium salts, halides and esters, although any photosensitive compound that produces an acid upon irradiation may be used. The onium salts are usually used in a form soluble in organic solvents, mostly as iodonium or sulfonium salts, examples of which are diphenyliodoinum trifluoromethane sulfonate, diphenyliodoinum nonafluorobutanesulfonate, triphenylsulfonium trifluromethanesuflonate, triphenylsulfonium nonafluorobutanesufonate and the like. Other compounds that form an acid upon irradiation may be used, such as triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, are also preferred.

The solid components of the present invention are dissolved in an organic solvent. The amount of solids in the solvent or mixture of solvents ranges from about 5 weight % to about 50 weight %. The polymer may be in the range of 5 weight % to 90 weight % of the solids and the photoacid generator may be in the range of 2 weight % to about 50 weight % of the solids. Suitable solvents for such photoresists may include propylene glycol mono-alkyl ether, propylene glycol alkyl (e.g. methyl) ether acetate, ethyl-3-ethoxypropionate, xylene, diglyme, amyl acetate, ethyl lactate, butyl acetate, 2-heptanone, ethylene glycol monoethyl ether acetate, and mixtures thereof.

Additives such as colorants, non-actinic dyes, antistriation agents, plasticizers, adhesion promoters, coating aids, speed enhancers and surfactants may be added to the photoresist composition before the solution is coated onto a substrate. A sensitizer that transfers energy from a particular range of wavelengths to a different exposure wavelength may also be added to the photoresist composition.

In order to improve the stability of the photoresist image after exposure, bases or photobases may be added to the photoresist composition. These bases are known to those skilled in the art and some of which are described the following references: U.S. Pat. No. 5,525,453 and U.S. Ser. No. 09/455872. Bases, which do not absorb or do not absorb significantly, at the wavelength of light used to expose the photoresist, are preferred. Bases such as dimethyliodonium hydroxide, trimethylsulfonium hydroxide and 1,3,3-trimethyl-6-azabicyclo[3.2.1]octane are preferred.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over an antireflective coating.

The photoresist coatings produced by the described procedure are particularly suitable for application to aluminum/aluminum oxide coated wafers, such as are utilized in the production of microprocessors and other miniaturized integrated circuit components. A silicon/silicon dioxide wafer can also be used. The substrate may also comprise various polymeric resins, especially transparent polymers such as polyesters.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the oven baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid base etching solution or dry etching. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Example 1

A copolymer is synthesized from 28.2 g of t-butyl norbornene carboxylate (BNC), 4.82 g of hydroxyethyl norbornene carboxylate (HNC), 1.82 g of norbornene carboxylic acid(NC), 7.85 g of mevaloniclactone methacrylate (MLMA) and 9.27 g of 2-methyladamantyl methacrylate (MAdMA) and 26 g of maleic anhydride(MA) in presence of 2 weight % of AIBN in tetrahydrofuran(THF) at 60% solid. The reaction was carried out under pressure, where the starting pressure was about 48,260 Pascals (7 psi) for 18 hours and the polymer was isolated from diethyl ether twice(1/10 v/v ratio). Test results for the polymer are shown in Table 1.

Example 2

The synthesis procedure of Example 1 was repeated using 15.89 g of BNC, 4.26 g of HNC, 1.61 g of NC, 11.60 g MLMA and 13.71 g of MAdMA, and 22.93 g of MA. The polymer was isolated as described in Example 1. Test results for the polymer are shown in Table 1.

Example 3

A copolymer is synthesized from 15.89 g of t-butyl norbornene carboxylate (BNC), 4.26 g of hydroxyethyl norbornene carboxylate (HNC), 1.61 g of norbornene carboxylic acid(NC), 11.60 g of mevaloniclactone methacrylate (MLMA) and 13.71 g of 2-methyladamantyl methacrylate (MAdMA) and 22.93 g of maleic anhydride(MA) in presence of 2 weight % of AIBN in tetrahydrofuran(THF) at 60% solid. The reaction was carried out under pressure, where the starting pressure was about 48,260 Pascals (7 psi) for 18 hours and the polymer was isolated from diethyl ether twice(1110 v/v ratio). Test results for the polymer are shown in Table 1.

Example 4

A copolymer is synthesized from 22.70 g of t-butyl norbornene carboxylate (BNC), 6.08 g of hydroxyethyl norbornene carboxylate (HNC), 2.31 g of norbornene carboxylic acid(NC), 16.57 g of mevaloniclactone methacrylate (MLMA) and 19.58 g of 2-methyladamantyl methacrylate (MAdMA) and 32.76 g of maleic anhydride(MA) in presence of 2 weight % of AIBN in tetrahydrofuran(THF) at 60% solid. The reaction was carried out under pressure, where the starting pressure was about 48,260 Pascals (7 psi) for 18 hours and the polymer was isolated from diethyl ether twice(1/10 v/v ratio). Test results for the polymer are shown in Table 1.

Example 5

A copolymer is synthesized from 34.05 g of t-butyl norbornene carboxylate (BNC), 9.13 g of hydroxyethyl norbornene carboxylate (HNC), 3.46 g of norbornene carboxylic acid(NC), 24.85 g of mevaloniclactone methacrylate (MLMA) and 29.38 g of 2-methyladamantyl methacrylate (MAdMA) and 49.14 g of maleic anhydride(MA) in presence of 2 weight % of AIBN in tetrahydrofuran(THF) at 60% solid. The reaction was carried out under pressure, where the starting pressure was about 48,260 Pascals (7 psi) for 18 hours and the polymer was isolated from diethyl ether twice(1/10 v/v ratio). Test results for the polymer are shown in Table 1.

Example 6

A copolymer is synthesized from 16.00 g of t-butyl norbornene carboxylate (BNC), 8.17 g of mevaloniclactone methacrylate (MLMA) and 9.66 g of 2-methyladamantyl methacrylate (MAdMA) and 16.16 g of maleic anhydride (MA) in presence of 2 weight % of AIBN in tetrahydrofuran (THF) at 60% solid. The reaction was carried out under pressure, where the starting pressure was about 48,260 Pascals (7 psi) for 18 hours and the polymer was isolated from diethyl ether twice(1/10 v/v ratio). Test results for the polymer are shown in Table 1.

Example 7

A copolymer is synthesized from 34.05 g of t-butyl norbornene carboxylate (BNC), 9.13 g of hydroxyethyl norbornene carboxylate (HNC), 3.46 g of norbornene carboxylic acid(NC), 24.85 g of mevaloniclactone methacrylate (MLMA) and 29.38 g of 2-methyladamantyl methacrylate (MAdMA) and 49.14 g of maleic anhydride(MA) in presence of 2 weight % of AIBN in tetrahydrofuran(THF) at 60% solid. The reaction was carried out under pressure, where the starting pressure was about 48,260 Pascals (7 psi) for 18 hours and the polymer was isolated from diethyl ether twice(1/10 v/v ratio). Test results for the polymer are shown in Table 1.

Example 8

A copolymer is synthesized from 28.27 g of t-butyl tetracyclo[$4.4.0.1^{2,6}1^{7,10}$]dodec-8-ene-3-carboxylate, 5.65 g of hydroxy ethyl norbornene carboxylate (HNC), 2.14 g of norbornene carboxylic acid(NC), 15.37 g of mevaloniclactone methacrylate (MLMA) and 18.17 g of 2-methyladamantyl methacrylate (MAdMA) and 30.40 g of maleic anhydride(MA) in presence of 2 weight % of AIBN in THF at 60% solid. The reaction was carried out under pressure, where the starting pressure was about 48,260 Pascals (7 psi) for 18 hours and the polymer was isolated from diethyl ether twice( 1/10 v/v ratio). Test results for the polymer are shown in Table 1.

Example 9

A copolymer is synthesized from 32.49 g of t-butoxycarbonylmethyl tetracyclo[4.4.0.1$^{2,6}$1.$^{7,10}$]dodec-8-ene-3-carboxylate, 5.31 g of hydroxyethyl norbornene carboxylate (HNC), 2.01 g of norbornene carboxylic acid(NC), 14.47 g of mevaloniclactone methacrylate (MLMA) and 17.10 g of 2-methyladamantyl methacrylate (MAdMA) and 28.61 g of maleic anhydride(MA) in presence of 2 weight % of AIBN in THF at 60% solid. The reaction was carried out under pressure, where the starting pressure was about 48,260 Pascals (7 psi) for 18 hours and the polymer was isolated twice from diethyl ether (1/10 v/v ratio). Test results for the polymer are shown in Table 1.

Example 10

A copolymer is synthesized from 22.72 g of t-butyl norbornene carboxylate (BNC), 6.08 g of hydroxy ethyl norbornene carboxylate (HNC), 2.31 g of norbornene carboxylic acid(NC), 16.57 g of mevaloniclactone methacrylate (MLMA) and 19.54 g of 2-methyladamantyl methacrylate (MAdMA) and 32.77 g of maleic anhydride(MA) in presence of 2 weight % of AIBN in THF at 60% solid. The reaction was carried in a glass flask for 8 hours and the polymer was isolated twice from diethyl ether (1/10 v/v ratio). Test results for the polymer are shown in Table 1.

Example 11

A copolymer is synthesized from 14.88 g of t-butyl norbornene carboxylate (BNC), 3.99 g of hydroxy ethyl norbornene carboxylate (HNC), 1.51 g of norbornene carboxylic acid(NC), 21.72 g of mevaloniclactone methacrylate (MLMA) and 25.62 g of 2-methyladamantyl methacrylate (MAdMA) and 32.24 g of maleic anhydride(MA) in presence of 2 weight % of AIBN in THF at 50% solid. The reaction was carried out in a 500 ml glass flask for 8 hours and the polymer was isolated twice from diethyl ether (1/10 v/v ratio). Test results for the polymer are shown in Table 1.

Example 12

14.802 g of poly(t-butyl norbornene carboxylate/ hydroxyethyl norbornene carboxylate/norbornene carboxylic acid/maleic anhydride/2-methyladamantyl methacrylate-co-2-mevaloniclactone methacrylate), from Example 1, 0.17776 g of triphenylsulphonium nonaflate, 0.0198 g of 1,3,3-trimethyl-6-azabicyclo[3.2.1]octane and 0.012 g of surfactant FC 430 (fluoroaliphatic polymeric ester, supplied by 3M Corporation, St. Paul, Minn.) were dissolved in 84.988 g of propyleneglycol methyletheracetate(PGMEA) to give a 100 g photoresist solution. The solution was filtered using 0.2 micron ($\mu$m) filter. Separately, a bottom antireflective coated (B.A.R.C) silicon substrate was prepared by spin coating the bottom anti-reflective coating solution of AZ® Exp ArF-1 (available from Clariant Corporation, Somerville, New Jersey) onto the silicon substrate and baked at 175° C. for 60 seconds. The B.A.R.C film thickness was 39 nm. The photoresist solution was then coated on the B.A.R.C coated silicon substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 110° C. for 90 seconds. The wafer was developed using 2.38 weight % aqueous solution of tetramethyl ammonium hydroxide for 60 seconds. The sensitivity, resolution, and depth of focus are shown in Table 2.

Example 13

14.802 g of poly(t-butylnorbornene carboxylate/ hydroxyethyl norbornene carboxylate/norbornene carboxylic acid/maleic anhydride/2-methyladamantyl methacrylate-co-2-mevaloniclactone methacrylate), from Example 2, 0.17776 g of triphenylsulphonium nonaflate, 0.0198 g of 1,3,3-trimethyl-6-azabicyclo[3.2.1]octane and 0.012 g of F-430 surfactant (fluoroaliphatic polymeric ester, supplied by 3M Corporation, St. Paul, Minn.) were dissolved in 84.988 g of PGMEA to give 100 g photoresist solution. The solution was filtered using 0.2 $\mu$m filter. Separately a silicon substrate was coated with a bottom anti-reflective coating (B.A.R.C.) solution, AZ® Exp ArF-1 (available from Clariant Corporation, Somerville, N.J.) onto the silicon substrate and baked at 175° C. for 60 seconds. The B.A.R.C film thickness was 39 nm. The photoresist solution was then coated on the B.A.R.C coated silicon substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 110° C. for 90 seconds. The wafer was developed using 2.38 weight % aqueous solution of tetramethyl ammonium hydroxide for 60 seconds. The sensitivity, resolution, and depth of focus are shown in Table 2.

Example 14

4.44077 g of poly(t-butylnorbomene carboxylate/ hydroxyethyl norbornene carboxylate/norbomene carboxylic acid/maleic anhydride/2-methyladamantyl methacrylate-co-2-mevaloniclactone methacrylate), from Example 3, 0.05329 g of triphenylsulphonium nonaflate, 0.00594 g of 1,3,3-trimethyl-6-azabicyclo[3.2.1]octane and 0.0036 g of F-430 surfactant (fluoroaliphatic polymeric ester, supplied by 3M Corporation, St. Paul, Minn.) were dissolved in 25.496 g of PGMEA to give 30 g photoresist solution. The solution was filtered using 0.2 $\mu$m filter. Separately a silicon substrate was coated with a bottom anti-reflective coating (B.A.R.C.) solution, AZ® Exp ArF-1 (available from Clariant Corporation, Somerville, N.J.) onto the silicon substrate and baked at 175° C. for 60 seconds. The B.A.R.C film thickness was 39 nm. The photoresist solution was then coated on the B.A.R.C coated silicon substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 110° C. for 90 seconds. The wafer was developed using 2.38 weight % aqueous solution of tetramethyl ammonium hydroxide for 60 seconds. The sensitivity, resolution, and depth of focus are shown in Table 2.

Example 15

12.69115 g of poly(t-butylnorbornene carboxylate/hydroxyethyl norbomene carboxylate/norbornene carboxylic acid/maleic anhydride/2-methyladamantyl methacrylate-co-2-mevaloniclactone methacrylate), from Example 4, 0.28552 g of triphenylsulphonium nonaflate, 0.02334 g of 1,3,3-trimethyl-6-azabicyclo[3.2.1]octane and 0.012 g of F-430 surfactant (fluoroaliphatic polymeric ester, supplied by 3M Corporation, St. Paul, Minn.) were dissolved in 86.988 g of PGMEA to give 100 g photoresist solution. The solution was filtered using 0.2 μm filter. Separately a silicon substrate was coated with a bottom anti-reflective coating (B.A.R.C.) solution, AZ200 Exp ArF-1 (available from Clariant Corporation, Somerville, N.J.) onto the silicon substrate and baked at 175° C. for 60 seconds. The B.A.R.C film thickness was 39 nm. The photoresist solution was then coated on the B.A.R.C coated silicon substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 110° C. for 90 seconds. The wafer was developed using 2.38 weight % aqueous solution of tetramethyl ammonium hydroxide for 60 seconds. The sensitivity, resolution, and depth of focus are shown in Table 2.

Example 16

26.65 g of the polymer from Example 6, 0.599 g of triphenylsulphonium nonaflate 0.049 g of 1,3,3-trimethyl-6-azabicyclo[3.2.1]octane and 0.025 g of surfactant (fluoroaliphatic polymeric ester, supplied by 3M Corporation, St. Paul, Minn.) were dissolved in 84.988 g of PGMEA to give 100 g photoresist solution. The solution was filtered through a 0.2 μm filter. The photoresist solution was then coated on a siliconoxynitride substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 130° C. for 90 seconds. The photoresist was developed using 2.38 weight % aqueous solution of tetramethyl ammonium hydroxide for 30 seconds. The sensitivity, resolution, and depth of focus are shown in Table 2.

Example 17

3.90497 g of the polymer from Example 7, 0.08785 g of triphenylsulphonium nonaflate 0.00718 g of 1,3,3-trimethyl-6-azabicyclo[3.2.1]octane and 0.0048 g of surfactant (fluoroaliphatic polymeric ester, supplied by 3M Corporation, St. Paul, Minn.) were dissolved in 35.99 g of PGMEA to give 40 g photoresist solution. The solution was filtered through a 0.2 μm filter. The photoresist solution was then coated on a siliconoxynitride substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 130° C. for 90 seconds. The photoresist was developed using 2.38 weight % aqueous solution of tetramethyl ammonium hydroxide for 30 seconds. The sensitivity, resolution, and depth of focus are shown in Table 2.

Example 18

6.44 g of the polymer from Example 8, 0.145 g of triphenylsulphonium nonaflate 0.012 g of 1,3,3-trimethyl-6-azabicyclo[3.2.1]octane and 0.0072 g of surfactant (fluoroaliphatic polymeric ester, supplied by 3M Corporation, St. Paul, Minn.) were dissolved in 53.39 g of PGMEA to give IOg photoresist solution. The solution was filtered through a 0.2 μm filter. The photoresist solution was then coated on the siliconoxynitride substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 130° C. for 90 seconds. The photoresist was developed using 2.38 weight % aqueous solution of tetramethyl ammonium hydroxide for 30 seconds. The sensitivity, resolution, and depth of focus are shown in Table 2.

Example 19

6.62 g of the polymer from Example 11, 0.112 g of triphenylsulphonium nonaflate, 0.009 g of 1,3,3-trimethyl-6-azabicyclo[3.2.1]octane and 0.006 g of surfactant FC 430 (fluoroaliphatic polymeric ester, supplied by 3M Corporation, St. Paul, Minn.) were dissolved in 43.24 g of PGMEA to give 50 g photoresist solution. The solution was filtered through a 0.2 μm filter. The photoresist solution was then coated on the siliconoxynitride substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7) using a chrome on quartz binary mask. After exposure, the wafer was post-exposure baked at 130° C. for 90 seconds. The photoresist was developed using 2.38 weight % aqueous solution of tetramethyl ammonium hydroxide for 30 seconds. The sensitivity, resolution, and depth of focus are shown in Table 2.

Comparative Example 1

A copolymer is synthesized from 40.84 g of t-butyl norbornene carboxylate (BNC), 2.65 g of hydroxyethyl norbornene carboxylate (HNC), 2.04 g of norbornene carboxylic acid(NC), and 24.47 g of maleic anhydride(MA) in presence of 2 weight % of AIBN in tetrahydrofuran(THF) at 60% solid. The reaction was carried out under pressure, where the starting pressure was about 48,260 Pascals (7 psi) for 18 hours and the polymer was isolated from diethyl ether twice(1/10 v/v ratio). Test results for the polymer are shown in Table 1.

Comparative Example 2

4.44077 g of the polymer from Comparative Example 2, 0.05329 g of triphenylsulphonium nonaflate, 0.00594 g of 1,3,3-trimethyl-6-azabicyclo[3.2.1]octane and 0.0036 g of surfactant FC 430 (fluoroaliphatic polymeric ester, supplied by 3M Corporation, St. Paul, Minn.) were dissolved in 25.4964 g of PGMEA to give 30 g photoresist solution. The solution was filtered through a 0.2 μm filter. The photoresist solution was then coated on the siliconoxynitride substrate. The spin speed was adjusted such that the photoresist film thickness was 390 nm. The resist film was baked at 110° C. for 90 seconds. It was then exposed on a 193 nm ISI ministepper (numerical aperture of 0.6 and coherence of 0.7)

using a chrome on quartz binary mask. After exposure, the wafer was post-exposure baked at 130° C. for 90 seconds. The photoresist was developed using 2.38 weight % aqueous solution of tetramethyl ammonium hydroxide for 30 seconds. The sensitivity, resolution, and depth of focus are shown in Table 2.

TABLE 1

| Example # | Mw | Mn | PD | yield (%) | Dark Film Loss Å/min |
|---|---|---|---|---|---|
| 1 | 7400 | 3700 | 2.0 | 59 | 110 |
| 2 | 8997 | 3158 | 2.8 | 58 | 119 |
| 3 | 7628 | 3420 | 2.23 | 58 | 76.5 |
| 4 | 8523 | 3396 | 2.51 | 57 | 80 |
| 5 | 9178 | 3646 | 2.51 | 62 | 62 |
| 6 | 7453 | 3328 | 2.24 | 56 | 85 |
| 7 | 9529 | 2533 | 2.69 | 63 | 95 |
| 8 | 19,793 | 9794 | 2.02 | 84 | 0 |
| 9 | 6332 | 3475 | 1.82 | 59 | 195 |
| 10 | 6797 | 3174 | 2.14 | 65 | 83 |
| 11 | 4360 | 1642 | 2.6 | 64 | 80 |
| Comp. Ex. 1 | 9302 | 5553 | 1.67 | 60 | 341 |

PD is polydispersity.
Dark Film loss is the thickness of polymer film, lost in the developing solution in 60 seconds.

TABLE 2

| Example # | Polymer from Example # | FT μm | DTC MJ/cm² | DTP mJ/cm² | Resolution μm | DOF at 0.13 μm |
|---|---|---|---|---|---|---|
| 12 | 1 | 0.39 | 12 | 25 | 0.13 | * |
| 13 | 2 | 0.39 | 9 | 18.5 | 0.10 | 0.5 |
| 14 | 3 | 0.39 | 12 | 17 | 0.10 | 0.6 |
| 15 | 4 | 0.39 | 14 | 15 | 0.10 | 0.5 |
| 16 | 6 | 0.39 | 6 | 12 | 0.08 | 0.6 |
| 17 | 7 | 0.35 | 6 | 15 | 0.10 | * |
| 18 | 8 | 0.33 | 3 | 7 | 0.08 | * |
| 19 | 11 | 0.39 | 8.5 | 18 | 0.08 | 0.7 |
| Comp. Ex. 2 | Comp. Ex. 1 | 0.39 | 7 | 18 | 0.16 | poor |

FT is film thickness of the photoresist
DTC is the dose to clear a large image
DTP is the dose to print a small image
DOF is the depth of focus
* denotes that DOF was not measured

What is claimed is:

1. A photoresist composition comprising an admixture of;
   a) poly(maleic anhydride-co-t-butyl 5-norbornene-2-carboxylate-co-2-hydroxyethyl 5-norbornene-2-carboxylate-co-5-norbornene-2-carboxylic acid-co-2-methyl adamantyl methacrylate-co-mevalonic lactone) and,
   b) a compound or a mixture of compounds capable of producing acid upon irradiation.

2. The photoresist composition according to claim 1, where the composition is sensitive to wavelengths in the range of about 300 nm to about 100 nm.

3. The photoresist composition according to claim 1, where the compound capable of producing an acid upon irradiation is selected from triphenylsulphonium nonafluorobutane sulfonate, diphenyliodoinum trifluoromethane sulfonate, diphenyliodonium nonafluorobutanesulfonate, triphenylsulfonium trifluoromethanesulfonate, triazines, oxazoles, oxadiazoles, thiazoles, substituted 2-pyrones, phenol sulfonic esters, bis-sulfonylmethanes, bis-sulfonylmethanes and bis-sulfonyidiazomethanes.

4. The photoresist composition according to claim 1, where the composition further comprises additives.

5. The photoresist composition according to claim 4, where the additives are selected from dyes, film-forming agents, surfactants, photosensitive bases and bases.

6. The photoresist composition according to claim 5, where the photosensitive base is selected from dimethyl iodonium hydroxide and trimethyl sulfonium hydroxide.

7. The process of imaging a positive photoresist composition comprising the steps of:
   a) coating a substrate with a film of photoresist composition of claim 1;
   b) baking the substrate to substantially remove the solvent;
   c) imagewise irradiating the photoresist film;
   d) baking the photoresist film; and,
   e) developing the irradiated photoresist film using an alkali developer.

8. The photoresist composition according to claim 7, further comprising coating an antireflective film on the substrate prior to coating the photoresist.

9. The photoresist composition according to claim 8, further where the antireflective coating is sensitive at 193 nm.

10. The process of claim 7, wherein the photoresist film is imagewise irradiated with light of wavelength in the range of 100 nm to 300 nm.

11. The process of claim 7, wherein the heating in step d) ranges from a temperature of from about 90° C. to about 150° C. for from about 30 seconds to about 180 seconds on a hot plate or from about 15 minutes to about 40 minutes in an oven.

12. The process of claim 7, wherein the alkali developer comprises an aqueous solution of tetramethyl ammonium hydroxide.

* * * * *